(12) United States Patent
Koyama

(10) Patent No.: US 6,944,218 B2
(45) Date of Patent: Sep. 13, 2005

(54) ADAPTIVE FILTER HAVING A SMALL CIRCUIT SCALE WITH A LOW POWER CONSUMPTION AND TAP-COEFFICIENTS UPDATING METHOD OF ADAPTIVE FILTER

(75) Inventor: Masayuki Koyama, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 778 days.

(21) Appl. No.: 09/858,661

(22) Filed: May 17, 2001

(65) Prior Publication Data

US 2002/0006160 A1 Jan. 17, 2002

(30) Foreign Application Priority Data

Jul. 11, 2000 (JP) .......................................... 2000-209737

(51) Int. Cl.[7] .................................................. H03H 7/30
(52) U.S. Cl. ...................................... 375/232; 708/323
(58) Field of Search ................................ 375/229, 230, 375/231, 232, 233, 234, 235, 236, 316; 708/300, 319, 322, 323; 333/18, 25 R

(56) References Cited

U.S. PATENT DOCUMENTS 6,084,907 A * 7/2000 Nagano et al. ............. 375/230
6,266,366 B1 * 7/2001 Greiss et al. ............... 375/229
6,332,000 B1 * 12/2001 Lee ............................. 375/232

FOREIGN PATENT DOCUMENTS

| JP | 6-103696 | 4/1994 |
| JP | 10-322245 | 12/1998 |

* cited by examiner

Primary Examiner—Chieh M. Fan
(74) Attorney, Agent, or Firm—McDermott Will & Emery LLP

(57) ABSTRACT

An adaptive filter includes: a plurality of delay circuits which receive a first signal, a second signal obtained by delaying the first signal, and a tap coefficient, and generates a first delay signal obtained by delaying the first signal, and a second delay signal obtained by delaying the second signal, and based upon the first delay signal and the tap coefficient, calculates a set point signal for each of the delay circuits; an addition circuit which adds the set point signals for a set point signal as a whole; and a coefficient calculation circuit which is placed in each of the delay circuits and which sequentially selects the second delay signals, and based upon the selected second delay signal and the set point signal as a whole, sequentially calculates the tap coefficients for the respective delay circuits.

20 Claims, 14 Drawing Sheets

ADAPTIVE FILTER HAVING A SMALL CIRCUIT SCALE WITH A LOW POWER CONSUMPTION AND TAP-COEFFICIENTS UPDATING METHOD OF ADAPTIVE FILTER

BACKGROUND OF THE INVENTION

1. Field of the Invention

The present invention relates to an adaptive filter used for digital communication devices, etc., and more particularly to an adaptive filter which has a small circuit scale with low power consumption.

2. Description of the Background Art

There is a filter in which, based upon a signal received from an unknown system and an output from the filter to which the signal has been inputted, parameters of the unknown system (for example, impulse response) are identified. This filter has a so-called learning function, and is referred to as an adaptive filter. The application of this adaptive filter makes it possible to realize an echo canceller, a noise canceller, a hawling canceller, an adaptive equalizer, etc. for use in digital communication circuits. The adaptive filter used for such applications is provided with a plurality of delay circuits, and by repeatedly updating a tap coefficient that is determined for each of a plurality of delay circuits, calculations are made based upon the input signal and the updated tap coefficients so that the unknown system is identified.

In an adaptive filter related to the present invention, a tap coefficient updating section for updating the tap coefficients is designed to update once every cycle of the sampling time for an input signal. Since the tap coefficients are updated once every cycle of the sampling time, the tap coefficients are frequently updated. Therefore, for example, in an adaptive filter applied to a digital communication circuit which has an input signal having a fluctuating distortion, the resulting effect is that the time for eliminating the distortion of the input signal can be shortened.

In this manner, the adaptive filter for updating the tap coefficients once every cycle of the sampling time has an arrangement in which a plurality of delay circuits are cascade-connected with each other, and a tap coefficient updating section is placed in each of the delay circuits. Referring to FIGS. 11–16, an explanation will be given of the structure and operation of such an adaptive filter.

Referring to FIG. 11, the adaptive filter is provided with FFE (Feed Forward Linear Transversal Equalizer) section 1100 for an I-channel (In-pulse channel), FFE section 1110 for a Q-channel (Quadrature-pulse channel), DFE (Decision Feedback Equalizer) section 1120 for an I-channel, DFE section 1130 for a Q-channel and an error data output section 1400.

The I-channel FFE section 1100 and the Q-channel FFE section 1110 have the same structure. The I-channel DFE section 1120 and the Q-channel DEF section 1130 have the same structure. I-channel input data and Q-channel input data are respectively inputted to the FFE sections 1100 and 1110. I-channel error data and Q-channel error data are respectively inputted to the DFE sections 1120 and 1140.

The I-channel FFE section 1100 is provided with a tap 1102 that is a delay circuit on the first stage, a tap 1104 on the second stage, a tap 1106 on the third stage, and a center tap 1108.

Data is inputted to the tap 1102 on the first stage through its input terminal C1 for each sampling time T from a demodulator, etc. placed outside. The tap 1102 on the first stage carries out a process for delaying the inputted data for a predetermined time. Thereafter, the tap 1102 on the first stage outputs the delayed data from the output terminal C2. The delayed data, outputted from the tap 1102 on the first stage, is inputted to the input terminal C1 of the tap 1104 on the second stage, that is, the following stage.

A delay element 1109 carries out a delaying process so that, based upon the input time T of the data to the input terminal C1 of the tap 1102 on the first stage, the data inputted from the outside demodulator, etc. for each sampling time T is delayed by time 4T.

To the tap 1102 on the first stage is inputted the data delayed by time 4T through its input terminal D1 from the delay element 1109. The tap 1102 on the first stage carries out a delaying process so that the inputted data (data delayed by 4T) is further delayed for a predetermined time. Thereafter, the tap 1102 on the first stage outputs the delayed data from its output terminal D2. The delayed data, outputted from the tap 1102 on the first stage, is inputted to the input terminal D1 of the tap 1104 on the second stage, that is, the following stage.

The error data output section 1400 calculates error data and outputs the resulting data. The center tap 1108 carries out such a process that the error data, inputted to its terminal E1 from the error data output section 1400, is delayed for a predetermined time. Thereafter, the center tap 1108 outputs the delayed error data from the output terminal E2. The delayed error data, outputted from the center tap 1108, is inputted to the input terminal E1 of the tap 1106 on the third stage, that is, the preceding stage.

Here, the Q-channel FFE section 1110, the I-channel DFE section 1120 and the Q-channel DFE section 1130 respectively have the same structure as the I-channel FFE section 1100; therefore, the detailed description thereof will not be repeated here.

Referring to FIG. 12, the center tap 1108 of the adaptive filter of the present embodiment is provided with delay elements 1228, 1230 and 1232 which sequentially delay data inputted from the input terminal C1, a selection circuit 1234 which sequentially selects any of the output signal of the delay element 1228, the output signal of the delay element 1230, the output signal of the delay element 1232 and the input signal of the delay element 1232, and outputs the resulting signal, a multiplier 1236 which is connected to the selection circuit 1234, and multiplies the input data selected by the selection circuit 1234 and the tap coefficient, delay elements 1202, 1204 and 1206 which sequentially delay the data (data delayed by time 4T) inputted from the input terminal D1, a selection circuit 1208 which selects any of the input of the delay element 1202, the output of the delay element 1204, the output of the delay element 1206 and the input of the delay element 1206 so as to output the resulting signal, a multiplier 1212 which is connected to the selection circuit 1208, and multiplies the input data selected by the selection circuit 1208 by error data inputted from the input terminal E1, a tap coefficient calculation section 1210 which, based upon the output signal from the multiplier 1212, calculates the tap coefficient, and stores the calculated tap coefficient in coefficient registers 1220, 1222, 1224 and 1226, an addition circuit 1246 which adds set point data that is the result of multiplication between the tap coefficients outputted from the multiplier 1236 and the input data with respect to the taps of four stages contained in the center tap 1108, and a delay element 1238 which delays error data inputted from the input terminal E1.

The addition circuit 1246 includes an adder 1240 for adding the set point data that are the results of multiplication, a register 1242 for temporarily stores the set point data and a multiplexer 1244 for processing a plurality of input signals. Here, the initial value of the set point data in the center tap 1108 is zero. The set point data corresponding to the four stages that is added by the addition circuit 1246 is outputted from the output terminal B, and inputted to the input terminal A of the tap 1106 on the preceding stage.

The delay elements 1202, 1204, 1206, 1228, 1230, 1232 and 1238, shown in FIG. 12, are operated by a sampling frequency, and the coefficient registers 1220, 1222, 1224 and 1226, the register 1242, the selectors 1208, 1234 and the multiplexer 1244 are operated at a speed four times as fast as the sampling frequency.

Referring to FIG. 13, the respective taps 1102, 1104 and 1106 have the same structure as the center tap 1108 except for the following three points: The first point is that the set point data calculated in the addition circuit 1296 is added to the set point data up to the tap on the preceding stage inputted through the input terminal A; the second point is that the input data is outputted to the output terminal C2, and inputted to the input terminal C1 of the tap on the succeeding stage; and the third point is that the input data (data delayed by time 4T) is outputted to the output terminal D2, and inputted to the input terminal D1 of the tap on the succeeding stage. The arrangements of the taps 1102, 1104 and 1106 other than these are the same as those of the center tap 1108; therefore, the detailed description thereof will not be repeated here. The selection circuit 1258, the tap coefficient calculation section 1260, the selection circuit 1284 and the addition circuit 1296 shown in FIG. 13 respectively correspond to the selection circuit 1208, the tap coefficient calculation section 1210, the selection circuit 1234 and the addition circuit 1246 shown FIG. 12.

In the tap coefficient calculation sections 1210 and 1260, the tap coefficient Ck is calculated from the following expression:

$$Ck, \text{next} = Ck - \Delta \times E \times X(L-k)^*,$$

where $X(L-k)^*$ is the conjugation of data string $X(L-k)$ that is inputted as a complex number, $\Delta$ is a minute positive constant referred to as step number, and Ck is a tap coefficient calculated previously. In accordance with this expression, the tap coefficient Ck is updated, and based upon the result of multiplication of the updated tap coefficient Ck and the input data, the set point data is calculated.

In the arrangement as described above, the adaptive filter operates as follows: The output data (obtained by adding the results of multiplication the tap coefficient by the input data with respect to the 16 stages) corresponding to 16 stages (4 stages×4 taps) is outputted from the output terminal B of the tap 1102 on the first stage. The set point data corresponding to the 16 stages is inputted to an error data output section 1400. Based upon the inputted set point data, the error data output section 1400 reads out the estimated data preliminarily stored in the table. The error data output section 1400 calculates a difference between the calculated set point data and the readout estimated data, and inputs the resulting data to the center tap 1108 as error data. Based upon the inputted error data, the tap coefficient calculation sections 1210 and 1260 calculate a new tap coefficient, and the data of the coefficient registers 1220 to 1226 and 1270 to 1276 are updated. This operation cycle is repeated for each sampling time T. In this manner, the tap coefficients are gradually changed to an optimal value that is coincident with the distortion characteristic of the transmission path so that the set point data formed by eliminating distortion from the input data as much as possible is outputted from the output terminal B on the first stage as output data.

Referring to timing charts in FIGS. 14–16, a detailed explanation will be given of the operation of the adaptive filter in accordance with the present example, in particular, of the tap coefficients updating operation.

FIG. 14 shows delayed states in the respective taps of data supplied to the input terminal C1 of the respective taps. The names of the taps and signals in FIG. 14 are the same as those shown in FIG. 12 and FIG. 13. Referring to FIG. 14, the inputted data is sequentially delayed by the delay elements 1228, 1230, 1232, 1278, 1280 and 1282. In the respective taps, the delayed input data is multiplied by the tap coefficient with respect to the four stages, and the results of multiplication corresponding to the four stages are added with respect to the four taps, thereby obtaining set point data corresponding to 16 stages. This set point data is inputted to the error data output section 1400 so that, based upon the inputted set point data, the corresponding estimated data is read out and a difference between the calculated set point data and the readout estimated data is outputted as error data. For example, error data calculated based upon input data from DX01 data to DX16 data shown in FIG. 14 and the respective tap coefficients is allowed to form ERR4 data, and error data calculated based upon input data from DX02 data to DX17 data and the respective tap coefficients is allowed to form ERR5 data.

FIG. 15 shows a delayed state of data applied to the input terminal D1 of each tap (data delayed by time 4T from the data inputted at the terminal C1). The names of signals shown in FIG. 15 are the same as those shown in FIGS. 12 and 13. Referring to the Figures, the input data (data delayed by time 4T) is sequentially delayed by the delay elements 1202, 1204, 1206, 1252, 1254, and 1256. Based upon the delayed input data and the error data, a tap coefficient is calculated for each stage of each tap.

Referring to FIG. 16, for example, based upon ERR4 data and D2X01 data, the tap coefficient C1 data on the first stage of the center tap 1108 is calculated by the coefficient calculation section 1210. In the same manner, based upon ERR4 data and D2X02 data, the tap coefficient C2 data on the second stage of the center tap 1108 is calculated by the coefficient calculation section 1210; based upon ERR4 data and D2X03 data, the tap coefficient C3 data on the third stage of the center tap 1108 is calculated by the coefficient calculation section 1210; and based upon ERR4 data and D2X04 data, the tap coefficient C4 data on the fourth stage of the center tap 1108 is calculated by the coefficient calculation section 1210. The tap coefficients of the coefficient registers 1220 to 1226 are updated by the calculated tap coefficients. The updated tap coefficient of each coefficient register is outputted, and the tap coefficient is multiplied by the input data so that the set point data is obtained. The newly calculated tap coefficients C1 data, C2 data, C3 data and C4, shown in FIG. 16, are respectively multiplied by DX06 data, DX07 data, DX08 data and DX09 data. The set point data, calculated by adding the results of multiplication of 16 taps, and based upon the set point data, ERR9 data, that is, error data, is calculated. The tap coefficients updating process of this type is carried out for each sampling time T.

In the above-mentioned adaptive filter, the tap coefficients come to fit to the characteristic of a communication circuit by updating the tap coefficients repeatedly at high speeds, thereby eliminating distortion in a transmitted signal. The distortion of the transmitted signal can be eliminated in this manner; however, since the tap coefficients are updated repeatedly at high speeds, the power consumption of the adaptive filter is high.

SUMMARY OF THE INVENTION

An object of the present invention is to provide an adaptive filter which is used for eliminating distortion of a transmission path through which a digital signal is transmitted and which can achieve a reduction in the power consumption.

Another object of the present invention is to provide an adaptive filter which has a miniaturized circuit scale.

Still another object of the present invention is to provide an adaptive filter which can converge its tap coefficient to a tap coefficient that is suitable for a transmission path through which a digital signal is transmitted.

Still another object of the present invention is to provide a method for tap coefficients updating method for an adaptive filter, which can reduce the power consumption.

Still another object of the present invention is to provide tap coefficients updating method for an adaptive filter which can converge its tap coefficient to a tap coefficient that is suitable for a transmission path through which a digital signal is transmitted.

An adaptive filter in accordance with the present invention, which, based upon a first signal containing a distortion, outputs a set point signal that is a signal from which the distortion is eliminated as much as possible, is provided with a plurality of delay circuits which receive a first signal, a second signal obtained by delaying the first signal by a predetermined period of time and tap coefficients used for calculating a set point signal, and generates a first delay signal obtained by delaying the first signal by a predetermined period of time, and a second delay signal obtained by delaying the second signal by a predetermined period of time, and based upon the first delay signal and the tap coefficients, calculates a set point signal for each of the delay circuits, an addition circuit which is connected to the delay circuits and which adds the set point signals for the respective delay circuits calculated in the delay circuits so as to provide a set point signal as a whole, and a signal generation circuit for generating a third signal based upon the set point signal as a whole, a coefficient calculation circuit which is connected to the signal generation circuit, and which sequentially selects the second delay signals corresponding to the delay circuits, and based upon the selected second delay signal and the third signal, sequentially calculates the tap coefficients for the respective delay circuits, and a selection circuit which is connected to the coefficient calculation circuit and the delay circuits, and which sequentially transmits the tap coefficients to the delay circuits corresponding to the tap coefficients calculated by the coefficient calculation circuit.

In the adaptive filter, for example, a single coefficient calculation circuit is installed for a plurality of delay circuits. This single coefficient calculation circuit sequentially calculates the tap coefficients of the delay circuits. A set point signal is calculated for each of the delay circuits by using the tap coefficients calculated for the respective delay circuits. Consequently, since the coefficient calculation circuit need not be installed in each of the delay circuits, it is possible to provide an adaptive filter which has a miniaturized circuit scale with reduced power consumption.

An adaptive filter in accordance with another preferred aspect of the present invention, which, based upon a first signal containing a distortion, outputs a set point signal that is a signal from which the distortion is eliminated as much as possible, is provided with a plurality of delay circuits which receive a first input signal and a second input signal, and outputs a first output signal obtained by delaying the first input signal by a predetermined period of time, a second output signal obtained by delaying the second input signal by a predetermined period of time, and a third output signal that is a signal obtained by further delaying the first input signal as compared with the first output signal, the delay circuits being cascade-connected so that the first output signal from the M-numbered (M: natural number) forms the first input signal to the (M+1)-numbered delay circuit, and so that the second output signal from the (M+1)-numbered delay circuit forms the second input signal to the M-numbered delay circuit, each delay circuit being provided with a first holding circuit for holding the second output signal from the delay circuit on the preceding stage cascade-connected and a second holding circuit for holding the third output signal from the delay circuit on the succeeding stage cascade-connected. The adaptive filter is further provided with a selection circuit which has an input connected to an output of the first holding circuit and an output of the second holding circuit in each delay circuit, and sequentially selects and outputs the second output signal and the third output signal for each delay circuit and a coefficient calculation circuit which has an input connected to the output of the selection circuit, and based upon an output signal from the selection circuit, sequentially calculates a tap coefficient for each delay circuit, and the delay circuit is further provided with a multiplier which is connected to an output of the coefficient calculation circuit, and multiplies the tap coefficient of each delay circuit by the first output signal from the delay circuit on the preceding stage so as to provide a set point signal for each delay circuit, the adaptive filter being further provided with an adder which sequentially calculates the set point signals of the respective delay circuits calculated by the multipliers so as to output a set point signal as a whole, and an output circuit which is connected to the adder and which calculates a difference between the set point signal as a whole and an estimated signal that is a predetermined optimal signal without any distortion, and outputs the resulting signal to the delay circuit as the second input signal.

In the adaptive filter, for example, based upon the first output signal that has been held for N times the sampling time by the first holding circuit and the second output signal that has been held for N times the sampling time by the second holding circuit, the coefficient calculation circuit sequentially calculates the tap coefficient for each of the delay circuits once every N times of the sampling time. As a result, the coefficient calculation circuit need not be installed in each of the delay circuits, and the coefficient calculation circuit only calculates the tap coefficients once every N times of the sampling time; therefore, it is possible to provide an adaptive filter that has a miniaturized circuit scale with reduced power consumption.

More specifically, the coefficient calculation circuit includes a circuit which preliminarily reads the initial value of the tap coefficient that is suitable for a transmission path in which the adaptive filter is used, and based upon the initial value, and which sequentially calculates the tap coefficients of each of the delay circuits based upon the initial value.

Since the initial value that is suitable for the transmission path through which the digital signal is transmitted is read and since the tap coefficients are calculated based upon the initial value, it is possible to provide an adaptive filter which can shorten the distortion eliminating time.

Tap coefficients updating method of an adaptive filter in accordance with still another preferred aspect of the present invention uses an adaptive filter that, based upon a first signal containing a distortion, outputs a set point signal that is a signal from which the distortion is eliminated as much as possible, and that is provided with a plurality of delay circuits which receive a first input signal and a second input signal, and outputs a first output signal obtained by delaying the first input signal by a predetermined period of time, a second output signal obtained by delaying the second input signal by a predetermined period of time, and a third output signal that is a signal obtained by further delaying the first input signal as compared with the first output signal, the delay circuits being cascade-connected so that the first output signal from the M-numbered (M: natural number) forms the first input signal to the (M+1)-numbered delay circuit, and so that the second output signal from the (M+1)-numbered delay circuit forms the second input signal to the M-numbered delay circuit, each delay circuit being provided with a first holding circuit for holding the second output signal from the delay circuit on the preceding stage cascade-connected and a second holding circuit for holding the third output signal from the delay circuit on the succeeding stage cascade-connected. In this method, the adaptive filter is further provided with a selection circuit which has an input connected to an output of the first holding circuit and an output of the second holding circuit in each delay circuit, and sequentially selects and outputs the second output signal and the third output signal for each delay circuit and a coefficient calculation circuit which has an input connected to the output of the selection circuit, and based upon an output signal from the selection circuit, sequentially calculates a tap coefficient for each delay circuit, and the delay circuit is further provided with a multiplier which is connected to an output of the coefficient calculation circuit, and multiplies the tap coefficient of each delay circuit by the first output signal from the delay circuit on the preceding stage so as to provide a set point signal for each delay circuit, the adaptive filter being further provided with an adder which sequentially calculates the set point signals of the respective delay circuits calculated by the multipliers so as to output a set point signal as a whole, and an output circuit which is connected to the adder and which calculates a difference between the set point signal as a whole and an estimated signal that is a predetermined optimal signal without any distortion, and outputs the resulting signal to the delay circuit as the second input signal. The tap coefficients updating method of an adaptive filter is provided with the steps of: holding the second output signal from the delay circuit on the preceding stage that is series connected, holding the third output signal from the delay circuit on the succeeding stage that is cascade-connected, sequentially selecting the second output signal and the third output signal that have been held in the output signal holding steps and outputting the resulting signal, and sequentially calculating the tap coefficient for each delaying circuit based upon the second output signal and the third output signal outputted in the outputting step of the outputting signals.

In the adaptive filter, based upon the first output signal that has been held for N times the sampling time by the first holding step and the second output signal that has been held for N times the sampling time by the second holding step, the tap coefficient for each of the delay circuits is calculated once every N times of the sampling time in the coefficient calculation step. As a result, the tap coefficients are calculated only once every N times of the sampling time; therefore, it is possible to provide a tap coefficients updating method of an adaptive filter that has a reduced power consumption.

More preferably, the tap coefficients updating method of an adaptive filter is further provided with a step of preliminarily reading the initial value of the tap coefficient that is suitable for a transmission path in which the adaptive filter is used, and the coefficient calculating step further includes the step of sequentially calculating the tap coefficient for each delay circuit based upon the initial value.

Since the initial value that is suitable for the transmission path in which the adaptive filter is used is read, and since the tap coefficients are calculated based upon the initial value, it is possible to provide a tap coefficients updating method of an adaptive filter which can shorten the distortion eliminating time.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
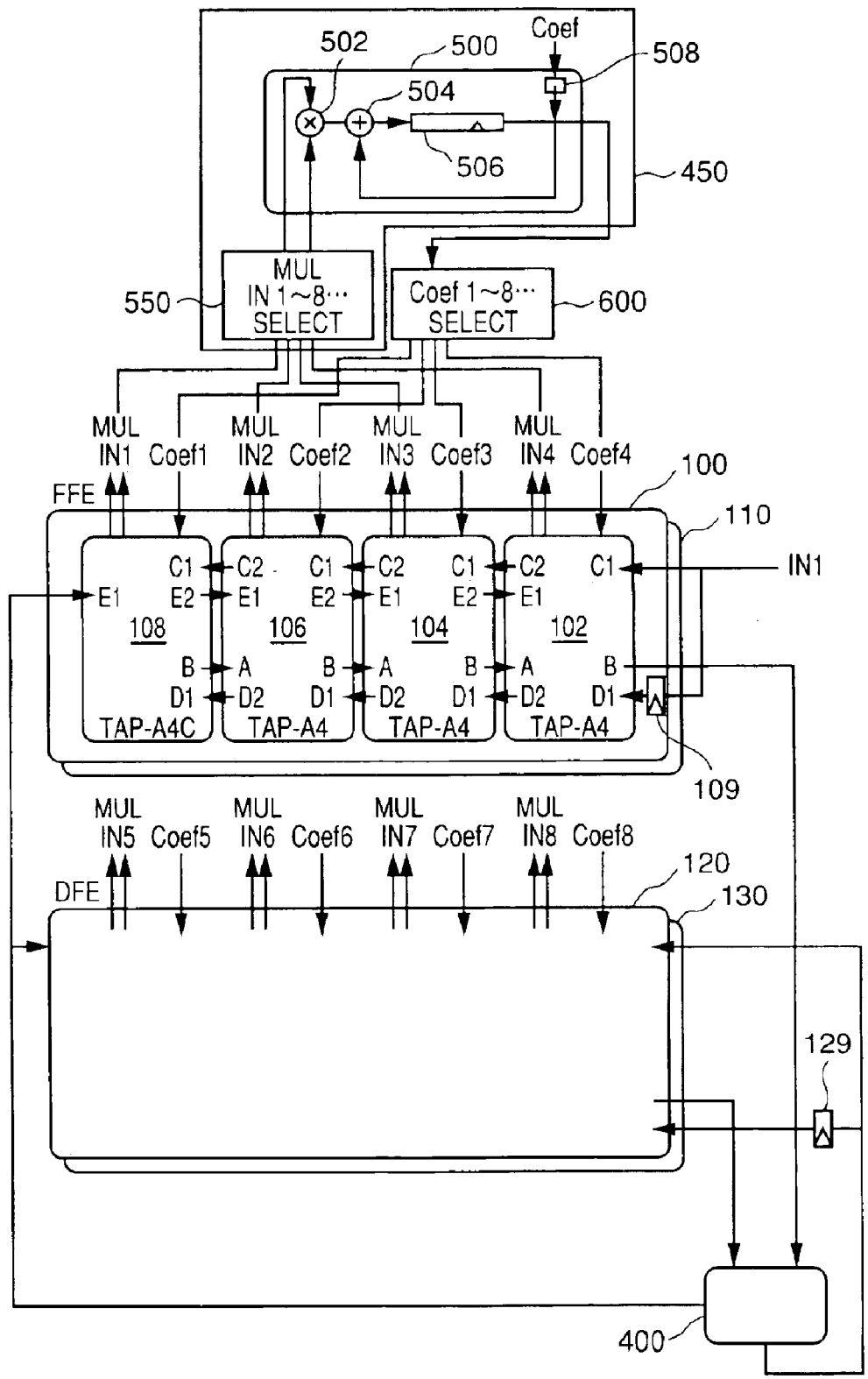
FIG. 1 is a drawing that shows the entire structure of an adaptive filter in accordance with one embodiment of the present invention.

Referring to Figures, the following description will discuss Embodiments of the present invention. Here, in the Figures, the same members are indicated by the same reference numerals. Those members have the same names and the same functions; therefore, the detailed description thereof will not be repeated where appropriate.

Referring to FIG. 1, an adaptive filter in accordance with the embodiment of the present invention includes a center tap 108 and a plurality of taps 102, 104 and 106 that generate delay data that is obtained by delaying input data, and calculate set point data based upon the delay data and tap coefficients, addition circuits (see reference numerals 246 and 296 in FIGS. 2 and 3), connected to the center tap 108 and the taps 102, 104 and 106, for adding set point data calculated in the respective taps so as to calculate set point data as a whole (by the addition circuit 296 in tap 102), an error data output section 400 (connected to the addition circuit 296 in tap 102 (see also FIG. 3)) for generating error data based upon the set point data as a whole, a tap coefficient calculation section 450, connected to the error data output section 400, for sequentially selecting the delay data corresponding to the center tap 108 and the taps 102, 104 and 106, and for sequentially calculating a tap coefficient for each of the delay circuits based upon the selected delay data and the error data, and a tap coefficient selection section 600, connected to the tap coefficient calculation section 450, the center tap 108 and the taps 102, 104 and 106, for sequentially transmitting the calculated tap coefficients to the tap corresponding to the tap coefficients calculated by the tap coefficient calculation section 450.

Based upon the calculated set point data as a whole, the error data output section 400 reads out estimated data preliminarily stored in a table. The error data output section 400 calculates a difference between the calculated set point data and the readout estimated data as error data.

A detailed explanation will be further given of the construction of the adaptive filter of the present embodiment.

In FIG. 1, the adaptive filter of the present embodiment is provided with FFE section 100 for an I-channel and FFE section 110 for a Q-channel, DFE section 120 for an I-channel, DFE section 130 for a Q-channel and an error data output section 400. The FFE section exclusively eliminates a distortion component (distortion component referred to as precursor) that precedently appears in the center tap. The DFE section exclusively eliminates a distortion component (distortion component referred to as post-cursor) that succeedingly appears in the center tap.

The I-channel FFE section 100 and the Q channel FFE section 110 have the same construction. The I-channel DFE section 120 and the Q-channel DEF section 130 have the same construction. Input data of I channel and input data of Q channel are respectively inputted to the FFE sections 100 and 110. Error data of I channel and error data of Q channel are respectively inputted to the DFE sections 120 and 130.

The I-channel FFE section 100 includes a tap 102 that is a delay circuit on the first stage, a tap 104 on the second stage, a tap 106 on the third stage and a center tap 108 that are connected in series with each other.

Data is inputted to the tap 102 on the first stage through its input terminal C1 for each sampling time T from a demodulator, etc. placed outside. The tap 102 on the first stage carries out a process for delaying the inputted data for a predetermined time. Thereafter, the tap 102 on the first stage outputs the delayed data from the output terminal C2. The delayed data, outputted from the tap 102 on the first stage, is inputted to the input terminal C1 of the tap 104 on the second stage, that is, the following stage.

A delay element 109 carries out a delaying process so that, based upon the input time T of the data to the input terminal C1 of the tap 102 on the first stage, the data inputted from the outside demodulator, etc. for each sampling time T is delayed by time 4T.

To the tap 102 on the first stage is inputted the data delayed by time 4T through its input terminal D1 from the delay element 109. The tap 102 on the first stage carries out a delaying process so that the inputted data (data delayed by 4T) is delayed for a predetermined time. Thereafter, the tap 102 on the first stage outputs the delayed data from its output terminal D2. The delayed data, outputted from the tap 102 on the first stage, is inputted to the input terminal D1 of the tap 104 on the second stage, that is, the following stage.

The error data output section 400 calculates error data and outputs the resulting data The center tap 108 carries out such a process that the error data, inputted to its terminal E1 from the error data output section 400, is delayed for a predetermined time. Thereafter, the center tap 108 outputs the delayed error data from the output terminal E2. The delayed error data, outputted from the center tap 108, is inputted to the input terminal E1 of the tap 106 on the third stage, that is, the preceding stage.

Here, the Q-channel FFE section 110, the I-channel DFE section 120 and the Q-channel DFE section 130 respectively have the same structure as the I-channel FFE section 100; therefore, the detailed description thereof will not be repeated here.

Further, the adaptive filter is provided with the tap coefficient calculation section 450 connected to the error data output section 400 and the tap coefficient selection section 600 connected to the center tap 108 and the taps 102, 104 and 106 of the I-channel FFE section 100. The tap coefficient calculation section 450 includes a tap coefficient calculation circuit 500, and an input signal selection section 550 connected to the center tap 108 and taps 102, 104 and 106 of the I-channel FFE section 100.

The number of the tap coefficient calculation circuit 500 thus installed is one for a plurality of taps included in the FFE sections 100, 110 and the DFE sections 120, 130. The tap coefficient calculation circuit 500 includes a multiplier 502, connected to the input signal selection section 550, for multiplying the input data and the error data, a coefficient register 506 for temporarily storing the tap coefficients, an adder 504, connected to the multiplier 502 and the coefficient register 506, for adding the results of the multiplication, and an input section 508 to which an initial value of a tap coefficient, which is suited for a transmission path to which the adaptive filter is applied, is inputted.

The input signal selection section 550 selects input data and error data of I channel and Q channel to be inputted to the tap coefficient calculation circuit 500 for each tap, and outputs the resulting data.

The tap coefficient selection section 600 selects a tap corresponding to the tap coefficients calculated by the tap coefficient calculation circuit 500, and outputs the calculated tap coefficients to the selected tap.

Figure 2:
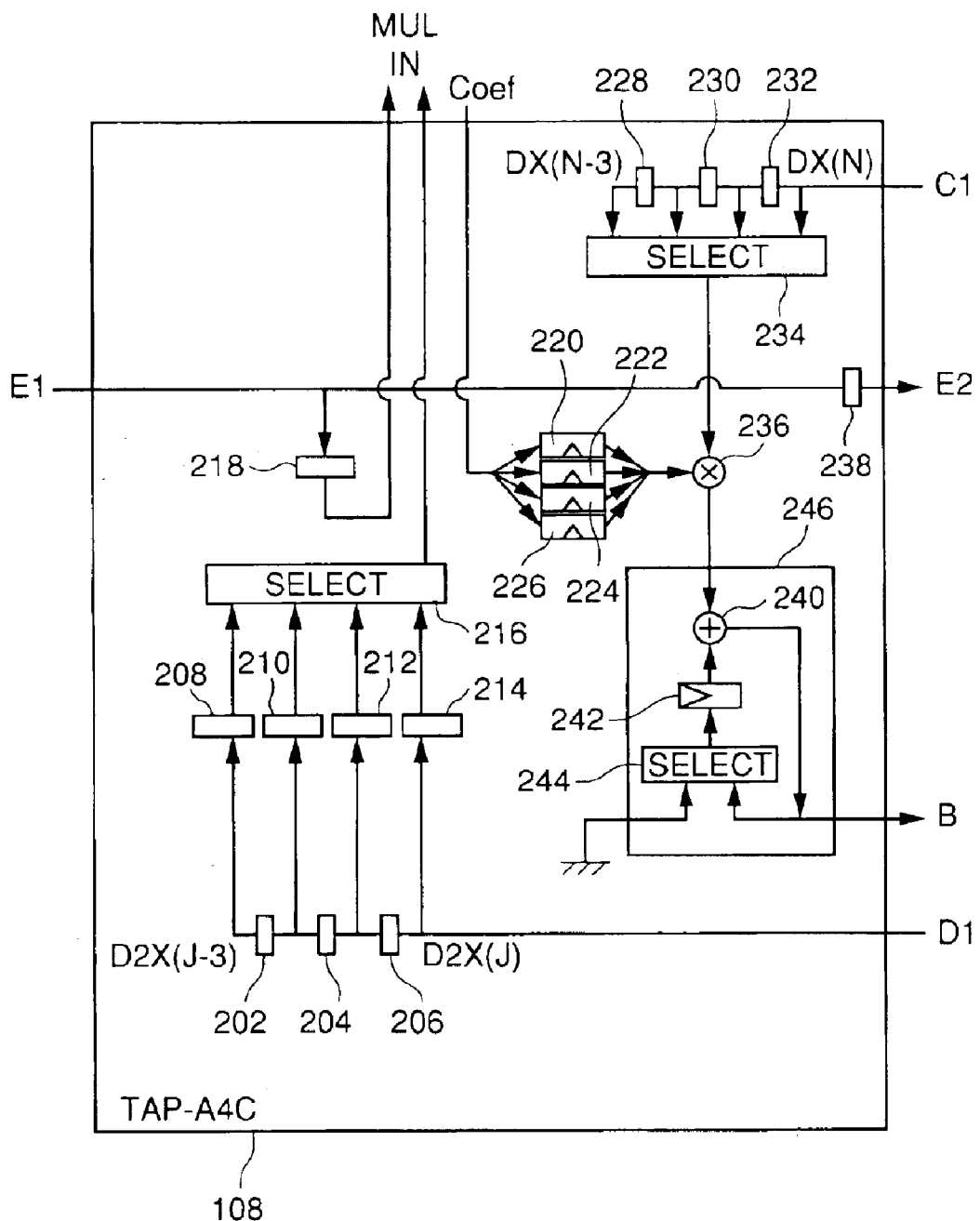
FIG. 2 is a drawing that shows the structure of the center tap of the adaptive filter in accordance with the embodiment of the present invention.

Referring to FIG. 2, the center tap 108 of the adaptive filter of the present embodiment is provided with delay elements 228, 230 and 232 which sequentially delay data inputted from the input terminal C1, a selection circuit 234 which sequentially selects any of the output signal of the delay element 228, the output signal of the delay element 230, the output signal of the delay element 232 and the input signal of the delay element 232, and outputs the resulting signal, a multiplier 236 which is connected to the selection circuit 234, and multiplies the input data selected by the selection circuit 234 and the tap coefficients, delay elements 202, 204 and 206 which sequentially delay the data (data delayed by time 4T) inputted from the input terminal D1, a holding circuit 208, 210 and 212 which respectively hold the output data from the delay elements 202, 204 and 206 for a predetermined time, a holding circuit 214 which holds input data to the delay element 206 for a predetermined time, a selection circuit 216 which selects any of the signals from the holding circuits 208, 210, 212 and 214, and output the resulting signal to the input signal selection section 550, a holding circuit 218 which is connected to the input terminal E1 for the error data and the input signal selection section 550, and holds the error data for a predetermined time, coefficient registers 220 to 226 which are connected to the tap coefficient selection section 600, and sequentially store the tap coefficients calculated by the tap coefficient calculation circuit 500, a multiplier 236 which is connected to the coefficient registers 220 to 226 and multiplies the tap coefficients stored in the coefficient registers 220 to 226 and the input data, an addition circuit 246 which adds the set point data that is the result of multiplication between the tap coefficients outputted from the multiplier 236 and the input data with respect to the taps of the four stages contained in the center tap 108, and a delay element 238 which delays the error data inputted from the input terminal E1.

The addition circuit 246 includes an adder 240 for adding the set point data that is the result of the multiplication, a register 242 for temporarily storing the set point data, a selection circuit 244 for processing a plurality of input signals. Selection circuit 244 selects one of an initial value and an output of adder 240 to supply the selected one for register 242. The initial value of the set point data in the center tap 108 is zero. The set point data corresponding to the four stages that is added by the addition circuit 246 is outputted from the output terminal B, and inputted to the input terminal A of the tap 106 on the preceding stage.

The delay elements 202, 204, 206, 228, 230, 232 and 238, shown in FIG. 2, are operated by a sampling frequency, and the coefficient registers 220, 222, 224 and 226, the register 242, the selectors 216, 234 and 244 are operated at a speed four times as fast as the sampling frequency.

Figure 3:
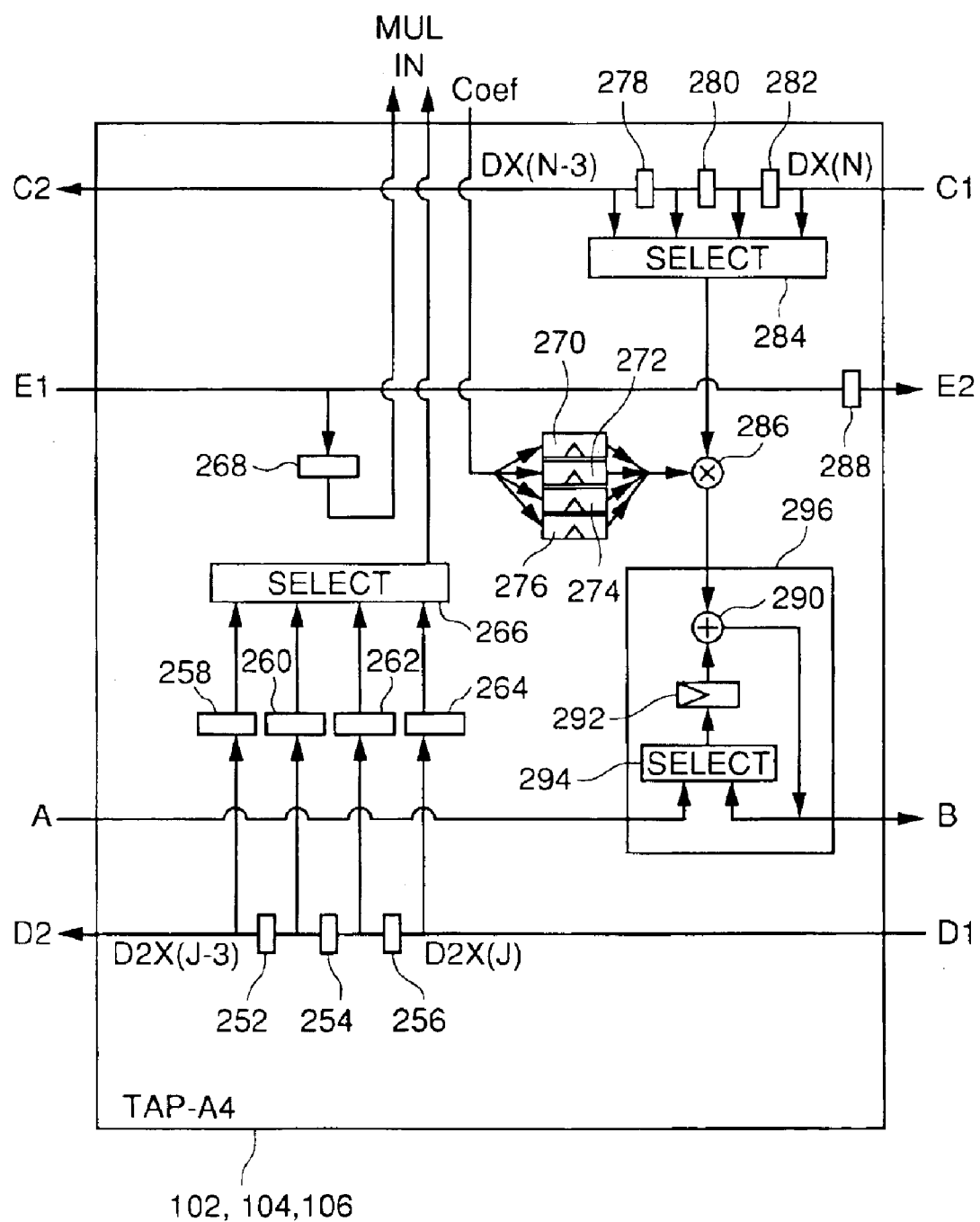
FIG. 3 is a drawing that shows the structure of each tap of the adaptive filter in accordance with the embodiment of the present invention.

Referring to FIG. 3, the respective taps 102, 104 and 106 have the same structure as the center tap 108 except for the following three points: The first point is that the set point data calculated in the addition circuit 296 is added to the set point data up to the tap on the preceding stage inputted through the input terminal A; the second point is that the input data is outputted to the output terminal C2, and inputted to the input terminal C1 of the tap on the succeeding stage; and the third point is that the input data (data delayed by time 4T) is outputted to the output terminal D2, and inputted to the input terminal D1 of the tap on the succeeding stage. The arrangements of the taps 102, 104 and 106 other than these are the same as those of the center tap 108; therefore, the detailed description thereof will not be repeated here. Selection circuits 266 and 284 and an addition circuit 296 shown in FIG. 3 respectively correspond to the selection circuit 216, 234 and the addition circuit 246.

Figure 4:
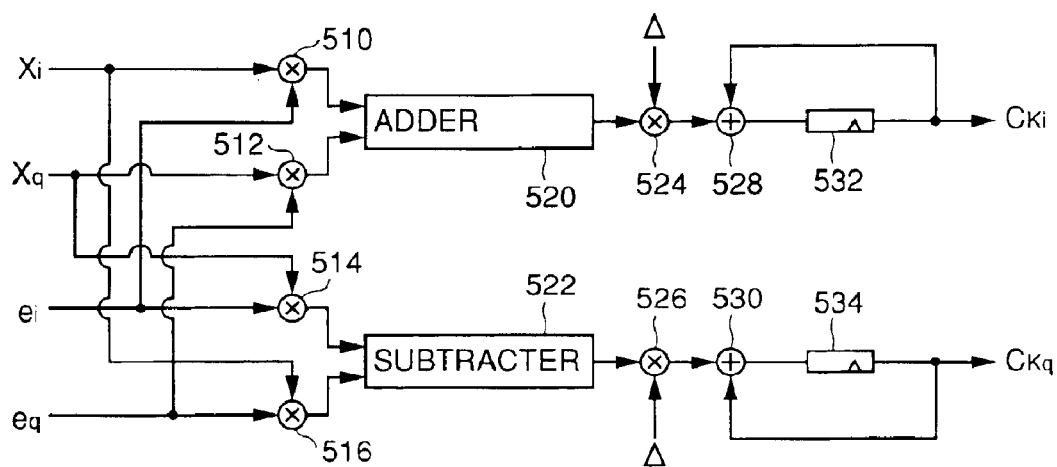
FIG. 4 is a drawing that shows the structure of tap coefficients generation section of the adaptive filter in accordance with the embodiment of the present invention.

In the tap coefficient calculation circuit 500, the tap coefficient Ck is calculated by a circuit shown in FIG. 4 based upon the above-mentioned expression. As illustrated in FIG. 4, the tap coefficient calculation circuit 500 is provided with four multipliers 510 to 516, an adder 520 having two inputs that are respectively connected to the output of the multiplier 510 and the output of the multiplier 512, a subtracter 522 having two inputs connected to the output of the multiplier 514 and the output of the multiplier 516, multipliers 524 and 526 which respectively have inputs connected to the output of the adder 520 and the output of the subtracter 522, and respectively multiplies the output of the adder 520 and the output of the subtracter 522 by a step number $\Delta$, registers 532 and 534 which temporarily store the tap coefficients, and adders 528 and 530 for adding the tap coefficients.

The multiplier 510 multiplies the input data of I channel by the error data of I channel. The multiplier 512 multiplies the input data of Q channel by the error data of Q channel. The multiplier 514 multiplies the input data of Q channel by the error data of I channel. The multiplier 516 multiplies the input data of I channel and the error data of Q channel. In I channel, the results of multiplication thus calculated are added by the adder 520, and in Q channel, the results of multiplication thus calculated are subtracted by the subtracter 522. By multiplying the result of addition and the result of subtraction by the step number $\Delta$, the tap coefficients of I channel and the tap coefficients of Q channel are calculated. In this manner, the tap coefficient Ck of I channel and Q channel is updated, and based upon the updated tap coefficient Ck and the input data, the set point data is calculated.

Figure 5:
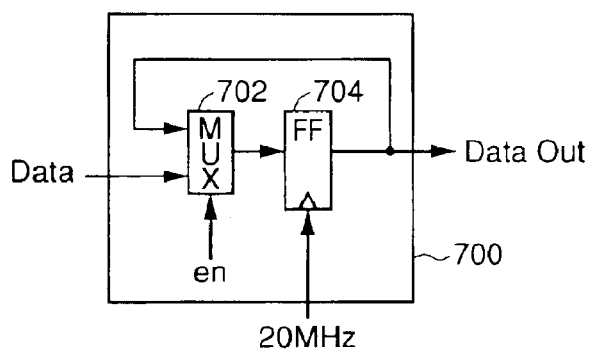
FIG. 5 is a drawing that shows the structure of a delay circuit in accordance with the embodiment of the present invention.
Figure 6:
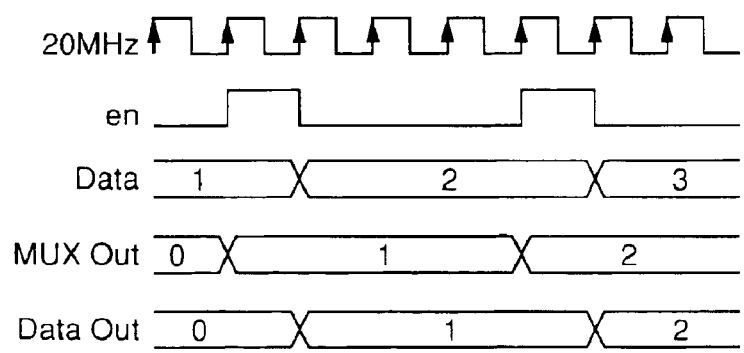
FIG. 6 is an operational timing chart of the delay circuit in accordance with the embodiment of the present invention.

Referring to FIG. 5 and FIG. 6, an explanation will be given of the delay elements 202 to 206, 228 to 232, 252 to 256, and 278 to 282, shown in FIG. 2 and FIG. 3. These delay elements have the same structure. FIG. 5 shows the structure of each delay element, and FIG. 6 shows an operation timing chart of the delay element.

As illustrated in FIG. 5, in the case when the sampling frequency of this adaptive filter is 20 MHz, the delay element includes a multiplexer 702 for receiving a data-in signal, a data-out signal and an enable signal en, and a flip-flop circuit 704 of an operational frequency of 20 MHz having data terminals connected in a manner so as to receive the output of the multiplexer 702. When the enable signal en goes high in synchronized timing as shown in FIG. 6, the data-out signal can be delayed by a period of time corresponding to four times the sampling time T based upon the data-in signal.

Here, each of the holding circuits 208 to 214, 218, 258 to 264, and 268, shown in FIG. 2 and FIG. 3, can be realized by a circuit in which the enable signal en shown in FIG. 5 is changed to a load signal. Each circuit holds the data-in circuit until the load signal goes high. In the following description, an explanation will be given, assuming that the load signal goes high every period of time 16T that is 16 times the sampling time.

The adaptive filter in accordance with the present embodiment, which has the above-mentioned arrangement, operates as follows: Set point data corresponding to 16 stages (4 stages×4 taps) is outputted from the output terminal B of the tap 102 on the first stage. The set point data corresponding to 16 stages is given to the error data output section 400. Based upon the inputted set point data, the error data output section 400 reads out estimated data preliminarily stored on the table. The error data output section 400 calculates a difference between the calculated set point data and the readout estimated data, and outputs this to the input terminal E1 of the center tap 108 as error data. The error data supplied to the input terminal E1 and the input data at the input terminal D1 are sequentially switched by the input signal selection section 550 for each tap. New tap coefficients are calculated by the tap coefficient calculation circuit 500, and the tap coefficients thus calculated are transmitted to the corresponding tap by the tap coefficient selection section 600. Based upon the tap coefficients transmitted from the tap coefficient selection section 600, the respective taps update the data in the coefficient registers 220 to 226 and 270 to 276. The update of each of these coefficient registers is carried out each time the load signal in each of the holding circuits 208 to 214 goes high, that is, once every period of time 16T, that is, 16 times the sampling time.

In this manner, the tap coefficients are gradually changed to an optimal value that is coincident with the distortion characteristic of the transmission path so that the set point data formed by eliminating distortion from the input data as much as possible is outputted from the output terminal B on the first stage as output data.

Referring to timing charts in FIGS. 7 to 10, a detailed explanation will be given of the operation of the adaptive filter in accordance with the present embodiment, in particular, of the tap coefficients updating operation.

Figure 7:
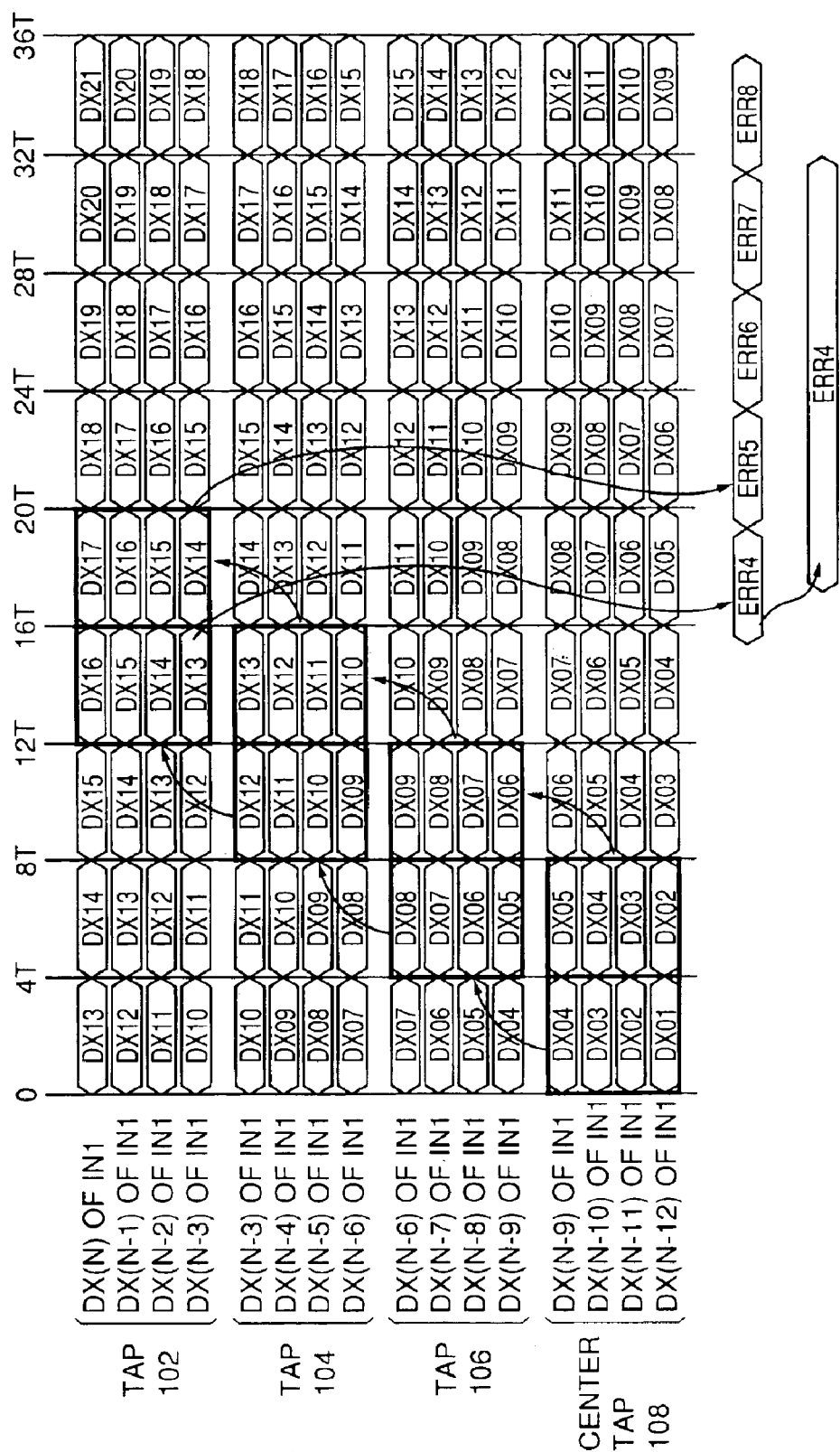
FIGS. 7 through 10 are operational timing charts of the adaptive filters in accordance with the present invention.

FIG. 7 shows delayed states in the respective taps of data supplied to the input terminal C1 of the respective taps. The names of the taps and signals in FIG. 7 are the same as those shown in FIG. 2 and FIG. 3. Referring to FIG. 7, the inputted data is sequentially delayed by the delay elements 228, 230, 232, 278, 280 and 282, and the delayed input data is multiplied by the tap coefficients four times at the respective taps; thus, the results of multiplication corresponding to the four stages are added with respect to the four taps, thereby obtaining set point data. This set point data is inputted to the error data output section 400 so that based upon the inputted set point data, the corresponding estimated data is read out and a difference between the calculated set point data and the readout estimated data is outputted as error data. For example, error data calculated based upon input data from DX01 data to DX16 data shown in FIG. 7 and the respective tap coefficients is allowed to form ERR4 data, and error data calculated based upon input data from DX02 data to DX17 data and the respective tap coefficients is allowed to form ERR5 data.

The ERR4 data is held for a period of time 16T by the holding circuits 218 and 268. Consequently, the ERR5 data, ERR6 data and ERR7 data are not held, and after the ERR4 data has been held for time 16T, the ERR8 data is held for the time period 16T.

Figure 8:
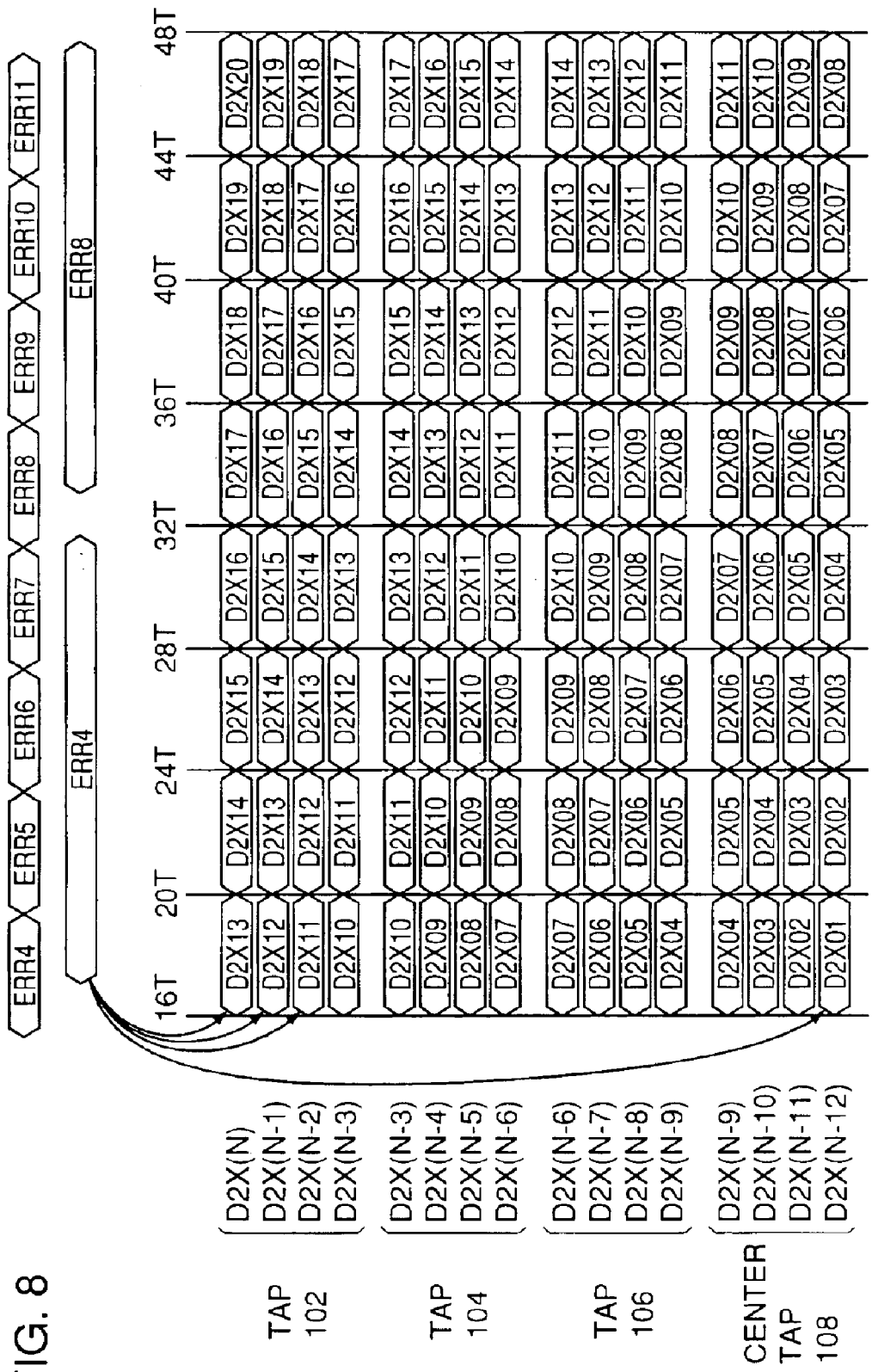

FIG. 8 shows a delayed state of data applied to the input terminal D1 of each tap (data delayed by time 4T from the data inputted at the terminal C1). The names of signals shown in FIG. 8 are the same as those shown in FIGS. 2 and 3. Referring to the Figures, the input data (data delayed by time 4T) is sequentially delayed by the delay elements 202, 204, 206, 252, 254, and 256. Based upon the delayed input data and the error data, a tap coefficient is calculated for each stage of each tap.

Figure 9:
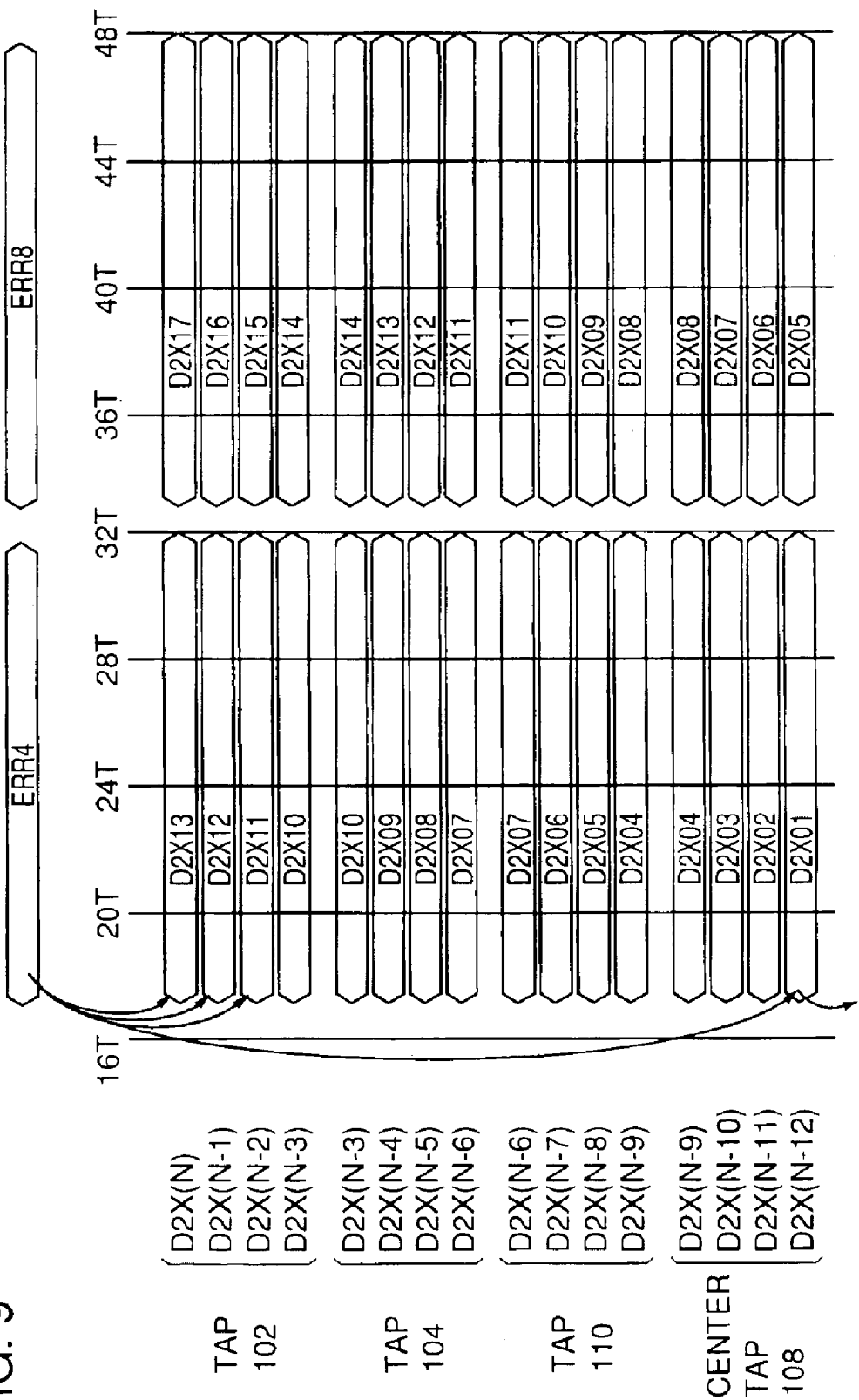

Referring to FIG. 9, in the adaptive filter in accordance with the present embodiment, D2X data is held by the holding circuits 208, 210, 212, 214, 258, 260, 262 and 264 by a period of time 16T. As a result, as illustrated in FIG. 9, the input data from D2X01 to D2X13 is maintained for the period of time 16T. For example, in the D2X(N-12) of the center tap 108, after D2X01 data has been held for the period of time 16T, the D2X02 data, D2X03 data and D2X04 data are not held, and after the D2X01 data has been held for the period of time 16T, the D2X05 data is held for the period of time 16T.

As illustrated in FIG. 9, the error data and input data that have been respectively held for the period of time 16T are selected by the input signal selection section 550 for each tap, and the selected error data and input data are outputted to the coefficient calculation circuit 500. In the tap coefficient calculation circuit 500, for example, based upon the ERR4 data and D2X01 data, the tap coefficient C1 data on the first stage of the center tap 108 is calculated. At this time, the initial value of the tap coefficient can be loaded. The tap coefficient selection section 600 transmits the tap coefficients calculated by the tap coefficient calculation circuit 500 to the tap for which the input signal selection section 550 selects the error data and the input data. Next, in the same manner, the ERR4 data and D2X02 data are selected by the input signal selection section 550 so that the tap coefficient C2 data on the second stage of the center tap 108 is calculated by the tap coefficient calculation circuit 500, and transmitted to the corresponding tap by the tap coefficient selection section 600. Next, the ERR4 data and D2X04 data are selected so that the tap coefficient C4 data on the fourth stage of the center tap 108 is calculated, and transmitted to the corresponding tap.

Figure 10:
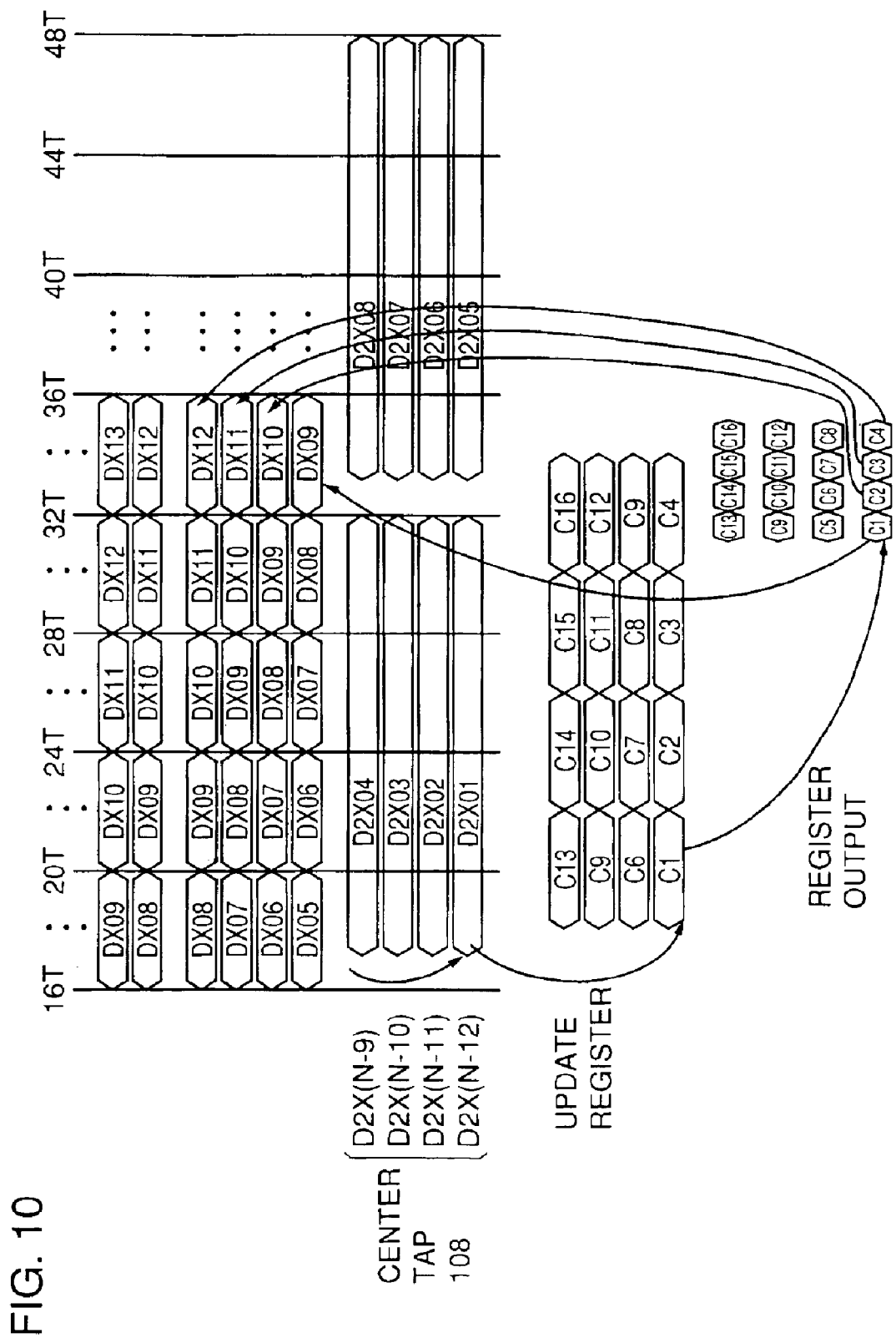
Figure 11:
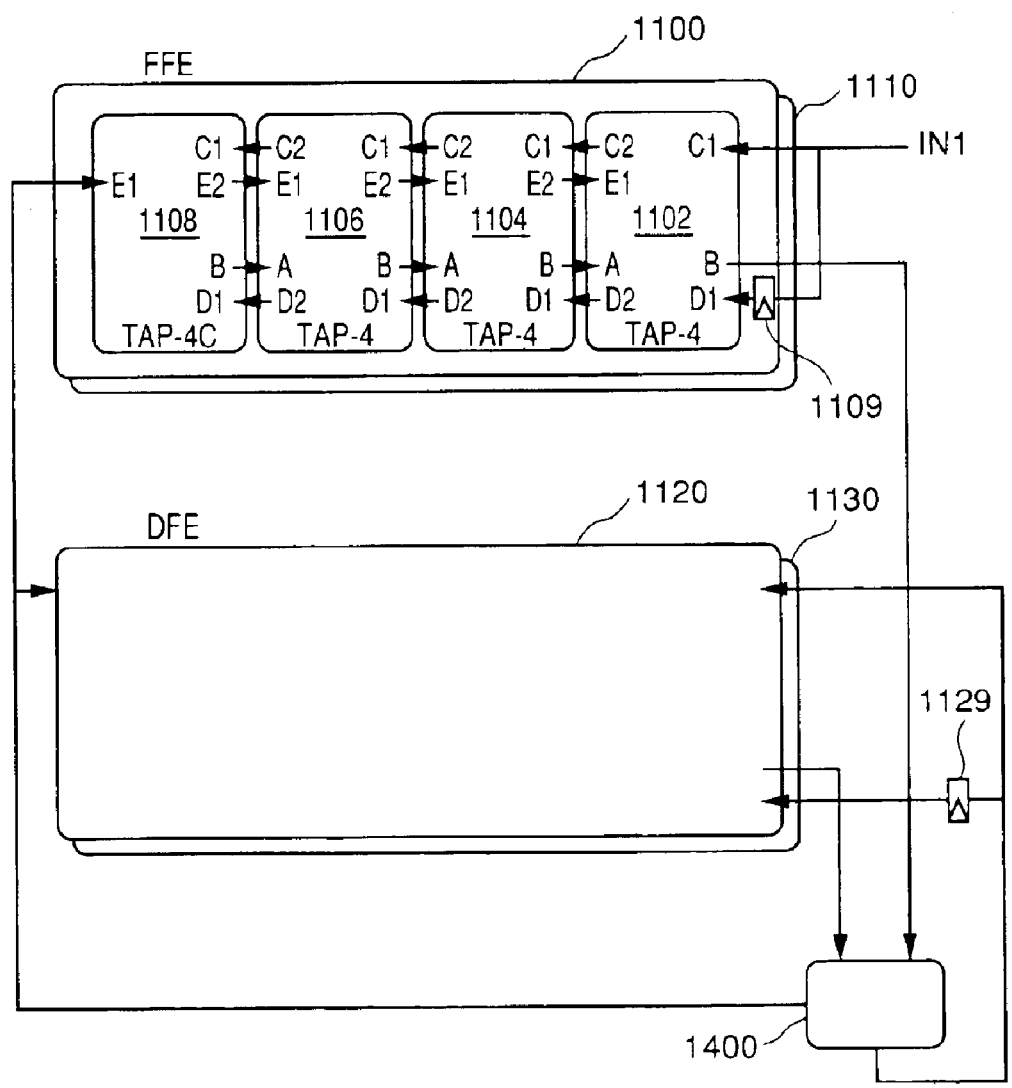
FIG. 11 is a drawing that shows the entire structure of the adaptive filter of the related art.
Figure 12:
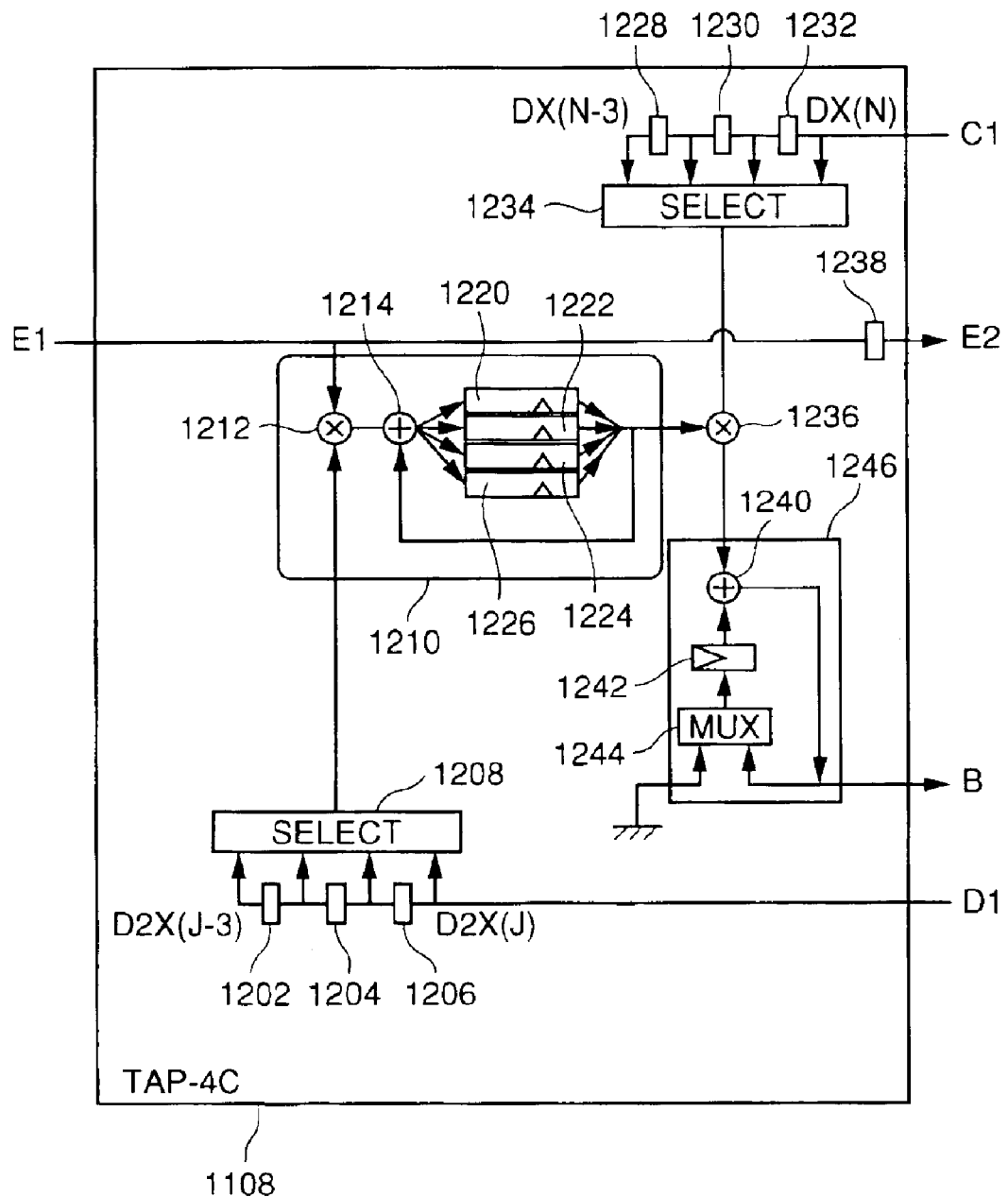
FIG. 12 is a block diagram that shows the construction of a center tap of the related art.
Figure 13:
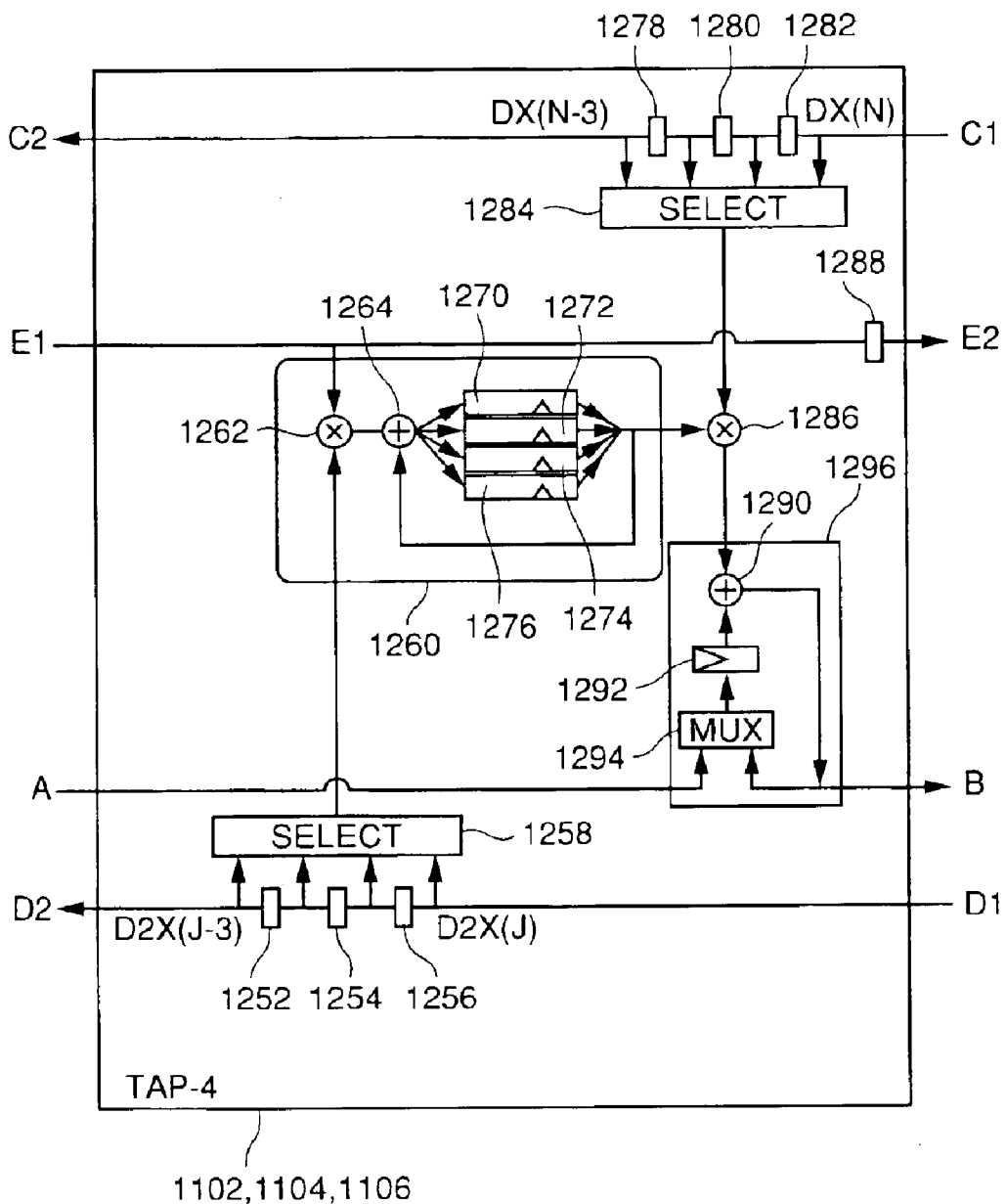
FIG. 13 is a block diagram that shows the respective constructions of taps of the adaptive filter of the related art.
Figure 14:
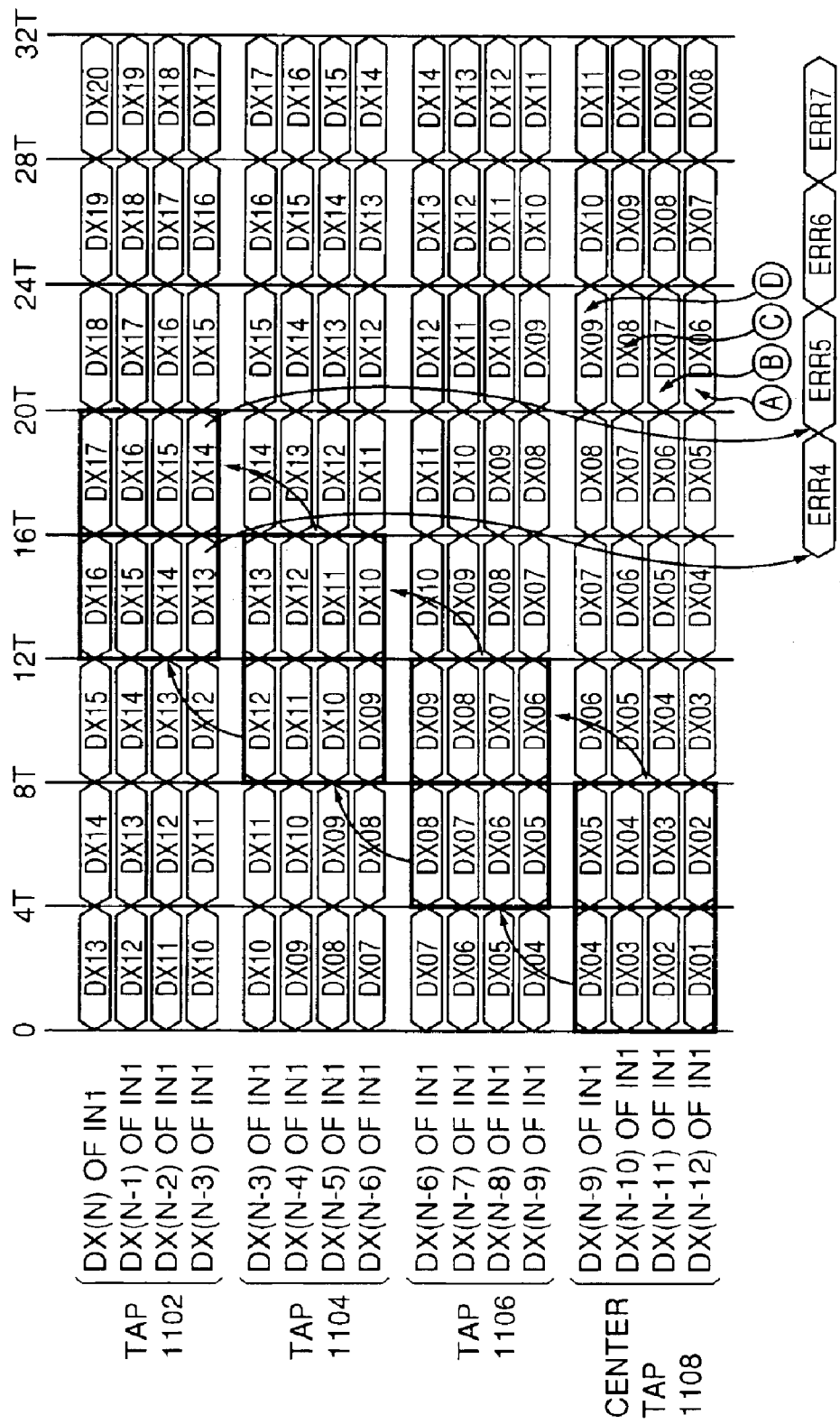
FIGS. 14 through 16 are operational timing charts of the adaptive filters of the related art.
Figure 15:
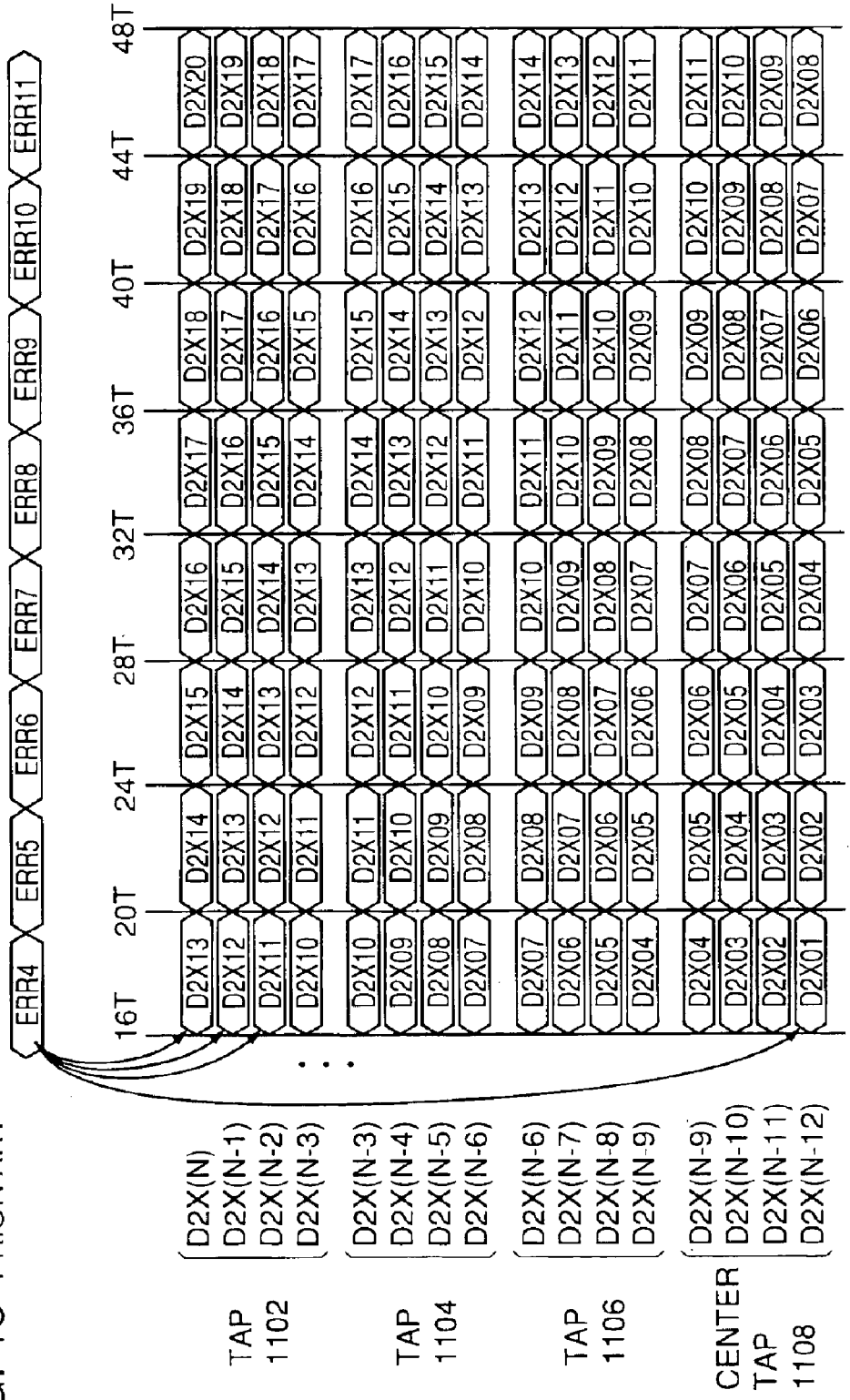
Figure 16:
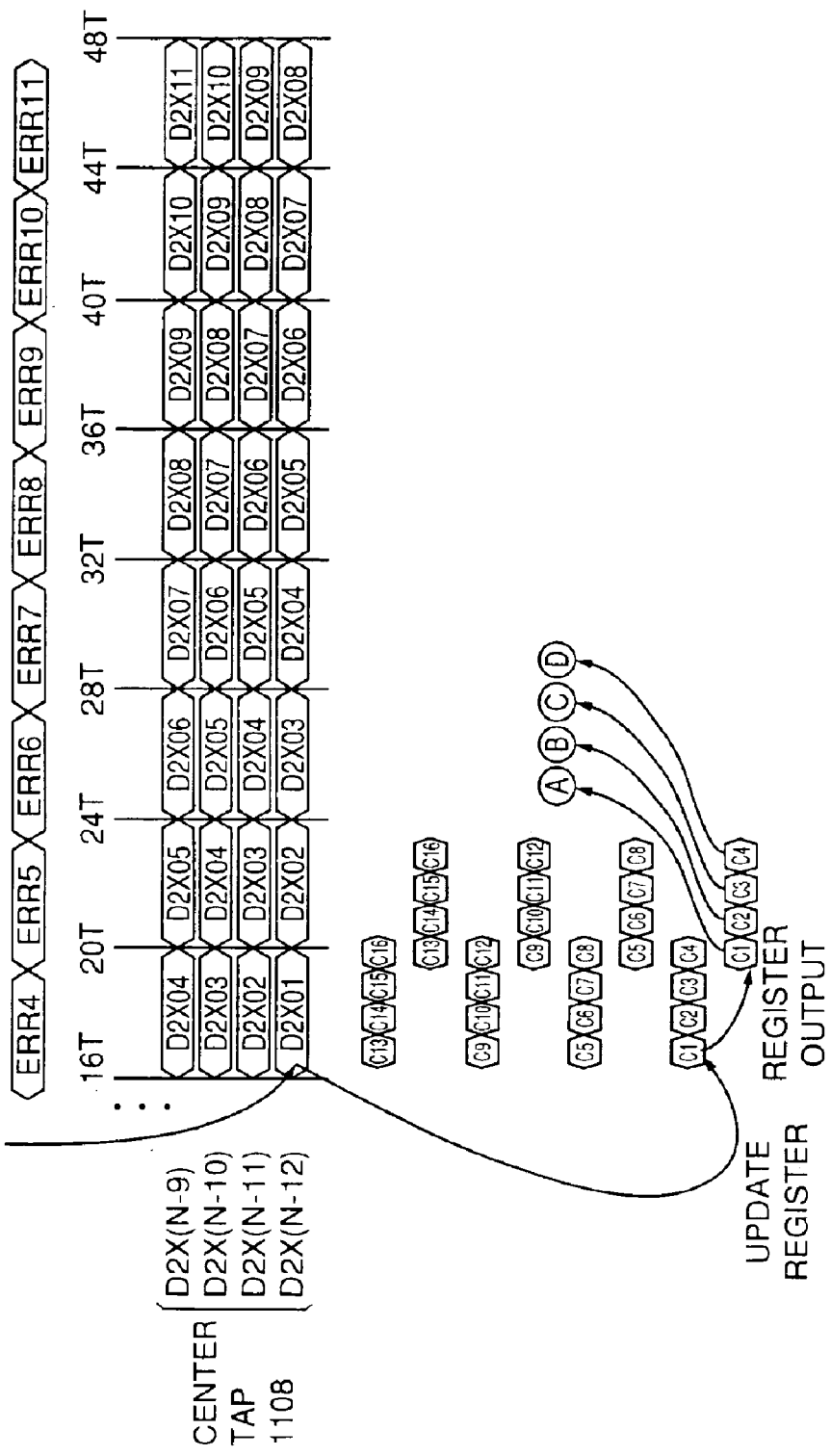

Referring to FIG. 10, the tap coefficients, transmitted to the center tap 108 and the taps 102, 104 and 106, updates the tap coefficients of the coefficient registers 220 to 226 and 270 to 276. The updated tap coefficient in each of the coefficient registers is outputted, and multiplied by the input data so that the set point data is calculated. The tap coefficient C1 data, C2 data, C3 data and C4 data, shown in FIG. 10, are respectively multiplied by the DX09 data, DX10 data, DX11 data and DX12 data, and the results of multiplication are added with respect to 16 taps so that the set point data is calculated. Based upon the set point data thus calculated, the corresponding estimated data is read out so that ERR8 data, which is error data obtained based upon the calculated set point data and the estimated data, is calculated.

In this manner, the update of each of these coefficient registers is carried out once every period of time 16T, that is, 16 times the sampling time. During the period of time from the sampling time at which the coefficients are updated to the next sampling time at which the coefficient is again updated, tap coefficients are not updated, and the set point data is calculated by using the same tap coefficients.

As described above, in the adaptive filter in accordance with the present embodiment, one tap coefficient section is installed with respect to a plurality of delay circuits, and the tap coefficients are updated only once every period of time that is N times the sampling time. As a result, it is possible to provide an adaptive filter which has a small circuit scale with low power consumption.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An adaptive filter comprising:

a plurality of delay circuits each of which receives a first signal, a second signal obtained by delaying said first signal by a first predetermined period of time, and a tap coefficient used for calculating a set point signal, and generates a first delay signal obtained by delaying said first signal by a second predetermined period of time, and a second delay signal obtained by delaying said second signal by a third predetermined period of time, and based upon said first delay signal and said tap coefficient, calculates the set point signal for each of said delay circuits;

an addition circuit which is connected to said delay circuits and which adds the set point signals for the respective delay circuits calculated in said delay circuits so as to provide a set point signal as a whole;

a signal generation circuit for generating a third signal based upon said set point signal as a whole, a coefficient calculation circuit which is connected to said signal generation circuit, and which sequentially selects the second delay signals corresponding to said delay circuits, and based upon the selected second delay signal and said third signal, sequentially calculates the tap coefficients for said respective delay circuits; and a selection circuit which is connected to said coefficient calculation circuit and said delay circuits, and which sequentially transmits said tap coefficients to said delay circuits corresponding to said tap coefficients calculated by said coefficient calculation circuit.

2. The adaptive filter according to claim 1, wherein the number of said coefficient calculation circuit is one for the plurality of delay circuits.

3. The adaptive filter according to claim 1, wherein said coefficient calculation circuit includes a circuit which preliminarily reads an initial value of said tap coefficient that is suitable for a transmission path in which said adaptive filter is used, and based upon said initial value, sequentially calculates said tap coefficient of each of said delay circuits based upon said initial value.

4. The adaptive filter according to claim 1, wherein said addition circuit is configured to be dispersed in the respective delay circuits, in which the dispersed addition circuits are connected to each other so as to provide said set point signal as a whole to said signal generation circuit.

5. An adaptive filter comprising:

a plurality of delay circuits each of which receives a first input signal and a second input signal, and outputs a first output signal obtained by delaying said first input signal by a first predetermined period of time, a second output signal obtained by delaying said second input signal by a second predetermined period of time, and a third output signal that is a signal obtained by further delaying said first input signal as compared with said first output signal, said delay circuits being cascade-connected so that said first output signal from an M-th of said plurality of delay circuits (M: natural number) forms said first input signal to an (M+1)-th of said plurality of delay circuits, and so that said second output signal from said (M+1)-th delay circuit forms said second input signal to said M-th delay circuit, each delay circuit comprising:

a first holding circuit for holding said second output signal from a delay circuit on a succeeding stage cascade-connected, and a second holding circuit for holding said third output signal from a delay circuit on a preceding stage cascade-connected, said adaptive filter further comprising:

a selection circuit which has an input connected to an output of said first holding circuit and an output of said second holding circuit in each delay circuit, and sequentially selects and outputs said second output signal and said third output signal for each delay circuit, and a coefficient calculation circuit which has an input connected to the said output of said selection circuit, and based upon an output signal from said selection circuit, sequentially calculates a tap coefficient for each delay circuit, each delay circuit further comprising:

a multiplier which is connected to an output of said coefficient calculation circuit, and multiplies said tap coefficient of each delay circuit by said first output signal from said delay circuit on said preceding stage so as to provide a set point signal for each delay circuit, said adaptive filter further comprising:

an adder which sequentially calculates the set point signals of the respective delay circuits calculated by said multiplier so as to output a set point signal as a whole, and an output circuit which is connected to said adder and which calculates a difference between said set point signal as a whole and an estimated signal that is a predetermined optimal signal without any distortion, and outputs a resulting signal obtained by calculation of said difference to said delay circuit as said second input signal.

6. The adaptive filter according to claim 4, wherein:

said first holding circuit comprises a circuit for holding said second output signal for N (N: natural number) times a sampling time, said second holding circuit comprises a circuit for holding said third output signal for N times said sampling time, said coefficient calculation circuit comprises a circuit for sequentially calculating said tap coefficient for each of said delay circuits once every N times of said sampling time based upon said second output signal and said third output signal, and each delay circuit further comprises a third holding circuit for holding said tap coefficient calculated by said coefficient calculation circuit for N times said sampling time.

7. The adaptive filter according to claim 5, wherein the number of said coefficient calculation circuit is one for the plurality of delay circuits.

8. The adaptive filter according to claim 5, wherein said coefficient calculation circuit includes a circuit which preliminarily reads an initial value of said tap coefficient that is suitable for a transmission path in which said adaptive filter is used, and based upon said initial value, sequentially calculates said tap coefficient of each of said delay circuits based upon said initial value.

9. The adaptive filter according to claim 5, wherein said third output signal from said M-th of said plurality of delay forms a third input signal to said (M+1)-th of said plurality of delay circuits, and each of said plurality of delay circuits further comprises:

a first delay element configured for outputting said first output signal obtained by delaying said first input signal;

a second delay element configured for outputting said second output signal obtained by delaying said second input signal; and a third delay element configured for outputting said third output signal obtained by delaying said third input signal.

10. The adaptive filter according to claim 9, wherein:

said first holding circuit comprises a circuit for holding said second output signal for N (N: natural number) times a sampling time, said second holding circuit comprises a circuit for holding said third output signal for N times said sampling time, said coefficient calculation circuit comprises a circuit for sequentially calculating said tap coefficient for each of said delay circuits once every N times of said sampling time based upon said second output signal and said third output signal, and each delay circuit further comprises a third holding circuit for holding said tap coefficient calculated by said coefficient calculation circuit for N times said sampling time.

11. The adaptive filter according to claim 9, wherein the number of said coefficient calculation circuit is one for the plurality of delay circuits.

12. The adaptive filter according to claim 9, wherein said coefficient calculation circuit includes a circuit which preliminarily reads an initial value of said tap coefficient that is suitable for a transmission path in which said adaptive filter is used, and based upon said initial value, sequentially calculates said tap coefficient of each of said delay circuits based upon said initial value.

13. The adaptive filter according to claim 5, wherein said adder is configured to be dispersed in the respective delay circuits, in which the dispersed adders are connected to each other so as to provide said set point signal as a whole to said output circuit.

14. A tap coefficient updating method of an adaptive filter, which uses an adaptive filter comprising:
a plurality of delay circuits each of which receives a first input signal and a second input signal, and outputs a first output signal obtained by delaying said first input signal by a first predetermined period of time, a second output signal obtained by delaying said second input signal by a second predetermined period of time, and a third output signal that is a signal obtained by further delaying said first input signal as compared with said first output signal,
wherein: said delay circuits are cascade-connected so that said first output signal from an M-th of said plurality of delay circuits (M: natural number) forms said first input signal to an (M+1)-th of said plurality of delay circuits, and so that said second output signal from said (M+1)-th delay circuit forms said second input signal to said M-th delay circuit;
each delay circuit comprising:
a multiplier for calculating a set point signal by multiplying said tap coefficient of each of said delay circuits by said first output signal from a delay circuit on a preceding stage,
said adaptive filter comprising:
an adder which sequentially calculates the set point signals of the respective delay circuits calculated by said multiplier so as to output a set point signal as a whole, and
an output circuit which is connected to said adder and which calculates a difference between said set point signal as a whole and an estimated signal that is a predetermined optimal signal without any distortion, and outputs a resulting signal obtained by calculation of said difference to said delay circuit as said second input signal,
said tap coefficient updating method of said adaptive filter comprising steps of:
holding said second output signal from a delay circuit on a succeeding stage that is cascade-connected,
holding said third output signal from said delay circuit on said preceding stage that is cascade-connected,
sequentially selecting said second output signal and said third output signal that have been held in the output signal holding steps and outputting the selected signal, and sequentially calculating said tap coefficient for each delaying circuit based upon said second output signal and said third output signal outputted in the outputting step.

15. The tap coefficient updating method of an adaptive filter according to claim 14, wherein said step of holding said second output signal further comprises a step of:
holding said second output signal for N times (N: natural number) a sampling time;
said step of holding said third output signal further comprises a step of:
holding said third output signal for N times said sampling time;

said step of calculating said tap coefficient comprises a step of:
calculating said tap coefficient for each of said delay circuits once every N times of said sampling time based upon said second output signal and said third output signal of each delay circuit, and
said tap coefficient updating method of said adaptive filter further comprises a step of:
holding said tap coefficient calculated in the coefficient calculating step for N times said sampling time.

16. The tap coefficient updating method of an adaptive filter according to claim 14, further comprising a step of:
preliminarily reading an initial value of said tap coefficient that is suitable for a transmission path in which said adaptive filter is used,
wherein said coefficient calculating step further comprises a step of:
sequentially calculating said tap coefficient for each delay circuit based upon said initial value.

17. The tap coefficient updating method of an adaptive filter according to claim 14, wherein
said third output signal from said M-th of said plurality of d forms a third input signal to said (M+1)-th of said plurality of delay circuits, and
each of said plurality of delay circuits further comprises:
a first delay element configured for outputting said first output signal obtained by delaying said first input signal;
a second delay element configured for outputting said second output signal obtained by delaying said second input signal; and
a third delay element configured for outputting said third output signal obtained by delaying said third input signal.

18. The tap coefficient updating method of an adaptive filter according to claim 17, wherein said step of holding said second output signal further comprises a step of:
holding said second output signal for N times (N: natural number) a sampling time;
said step of holding said third output signal further comprises a step of:
holding said third output signal for N times said sampling time;
said step of calculating said tap coefficient comprises a step of:
calculating said tap coefficient for each of said delay circuits once every N times of said sampling time based upon said second output signal and said third output signal of each delay circuit, and
said tap coefficient updating method of said adaptive filter further comprises a step of:
holding said tap coefficient calculated in the coefficient calculating step for N times said sampling time.

19. The tap coefficient updating method of an adaptive filter according to claim 17, further comprising a step of:
preliminarily reading an initial value of said tap coefficient that is suitable for a transmission path in which said adaptive filter is used,
wherein said coefficient calculating step further comprises a step of:
sequentially calculating said tap coefficient for each delay circuit based upon said initial value.

20. The adaptive filter according to claim 14, wherein said adder is configured to be dispersed in the respective delay circuits, in which the dispersed adders are connected to each other as to provide said set point signal as a whole to said output circuit.

* * * * *

UNITED STATES PATENT AND TRADEMARK OFFICE
CERTIFICATE OF CORRECTION

PATENT NO. : 6,944,218 B2  
DATED : September 13, 2005  
INVENTOR(S) : Masayuki Koyama It is certified that error appears in the above-identified patent and that said Letters Patent is hereby corrected as shown below:

Column 15,
Line 54, after "the", delete "said".

Column 16,
Line 8, change "4" to -- 5 --.
Line 35, after "delay" insert -- circuits --.

Column 18,
Line 22, change "d" to -- delay circuits --.

Signed and Sealed this

Twenty-fourth Day of January, 2006

JON W. DUDAS
*Director of the United States Patent and Trademark Office*